(12) United States Patent
Gardin et al.

(10) Patent No.: US 10,054,991 B2
(45) Date of Patent: Aug. 21, 2018

(54) COMPUTER PROVIDED WITH A TIGHT VENTILATOR AND PRODUCTION METHOD

(71) Applicants: CONTINENTAL AUTOMOTIVE FRANCE, Toulouse (FR); CONTINENTAL AUTOMOTIVE GMBH, Hannover (DE)

(72) Inventors: Philippe Gardin, Merville (FR); Jean-Michel Ader, Frouzins (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 15/532,893

(22) PCT Filed: Nov. 26, 2015

(86) PCT No.: PCT/EP2015/002380
§ 371 (c)(1),
(2) Date: Jun. 2, 2017

(87) PCT Pub. No.: WO2016/087032
PCT Pub. Date: Jun. 9, 2016

(65) Prior Publication Data
US 2018/0017998 A1    Jan. 18, 2018

(30) Foreign Application Priority Data

Dec. 3, 2014    (FR) ..................................... 14 61871

(51) Int. Cl.
G06F 1/18        (2006.01)
H05K 5/02       (2006.01)

(52) U.S. Cl.
CPC ........... *G06F 1/182* (2013.01); *H05K 5/0213* (2013.01)

(58) Field of Classification Search
CPC ...... G06F 1/182; G06F 1/1656; H05K 5/0213
See application file for complete search history.

(56) References Cited

U.S. PATENT DOCUMENTS 7,667,973 B2    2/2010    Shinoda et al.
8,475,554 B2 *  7/2013    Furuuchi ................ F21V 31/03
                                                          55/385.4
(Continued)

FOREIGN PATENT DOCUMENTS

DE    10 2011 004760 A1    9/2011
DE    10 2011 086108 A1    5/2013
(Continued)

OTHER PUBLICATIONS

International Search Report, dated Feb. 24, 2016, from corresponding PCT application.

*Primary Examiner* — William H Mayo, III
*Assistant Examiner* — Hiram E Gonzalez
(74) *Attorney, Agent, or Firm* — Young & Thompson

(57) ABSTRACT

Disclosed is a computer containing electronic components incorporating a liquid-tight and gas-permeable ventilator, including, on a part of the computer, a unit for protecting the ventilator against liquid spraying, which is created by stamping sheet metal making up the part receiving the ventilator, the protection unit being placed on one of the edges of the sheet metal part and then being folded onto the ventilator in order to make up, for the latter, a shield against liquid spraying. Also disclosed is the associated method.

20 Claims, 3 Drawing Sheets

(56) References Cited

U.S. PATENT DOCUMENTS

| | | | | |
|---|---|---|---|---|
| 8,699,231 B2* | 4/2014 | Shinoda | ............... | H05K 5/0047 |
| | | | | 174/520 |
| 2007/0134981 A1* | 6/2007 | Shinoda | ............... | H05K 5/0047 |
| | | | | 439/587 |
| 2008/0074840 A1* | 3/2008 | Suzuki | ................. | H05K 5/0047 |
| | | | | 361/679.46 |
| 2010/0103632 A1* | 4/2010 | Kato | ....................... | H05K 5/006 |
| | | | | 361/752 |
| 2011/0211311 A1 | 9/2011 | Shinoda | | |

FOREIGN PATENT DOCUMENTS

| | | |
|---|---|---|
| EP | 1 799 021 A2 | 6/2007 |
| FR | 2 932 784 A1 | 12/2009 |
| JP | 2006 005162 A | 1/2006 |

\* cited by examiner

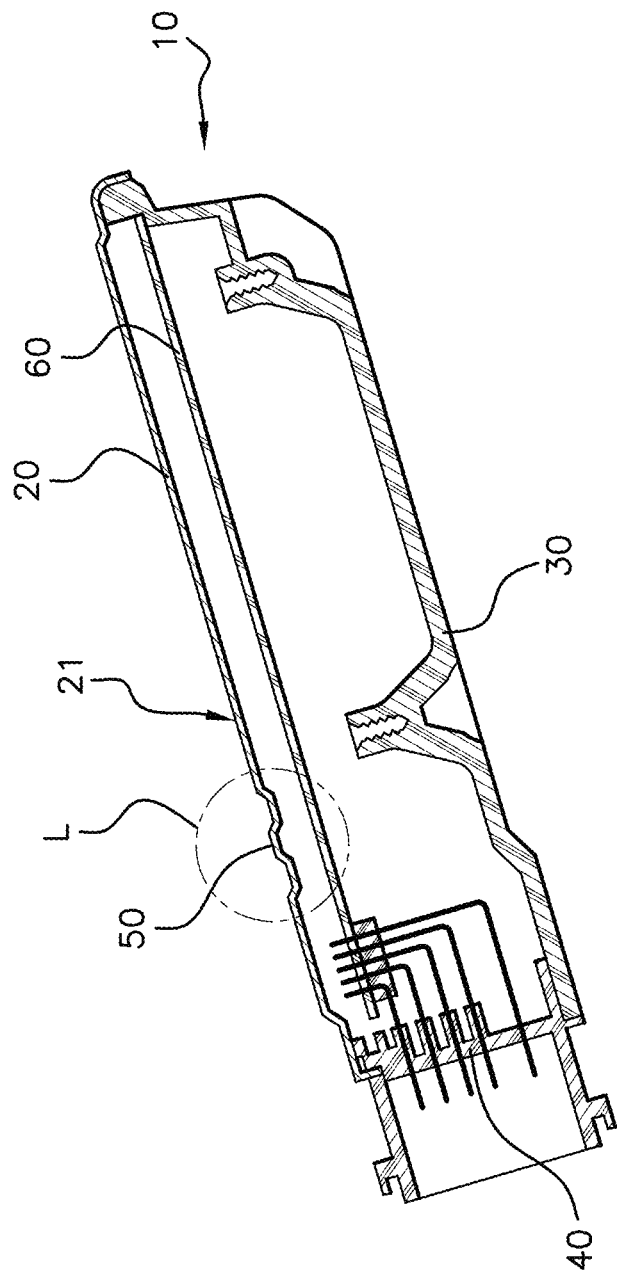

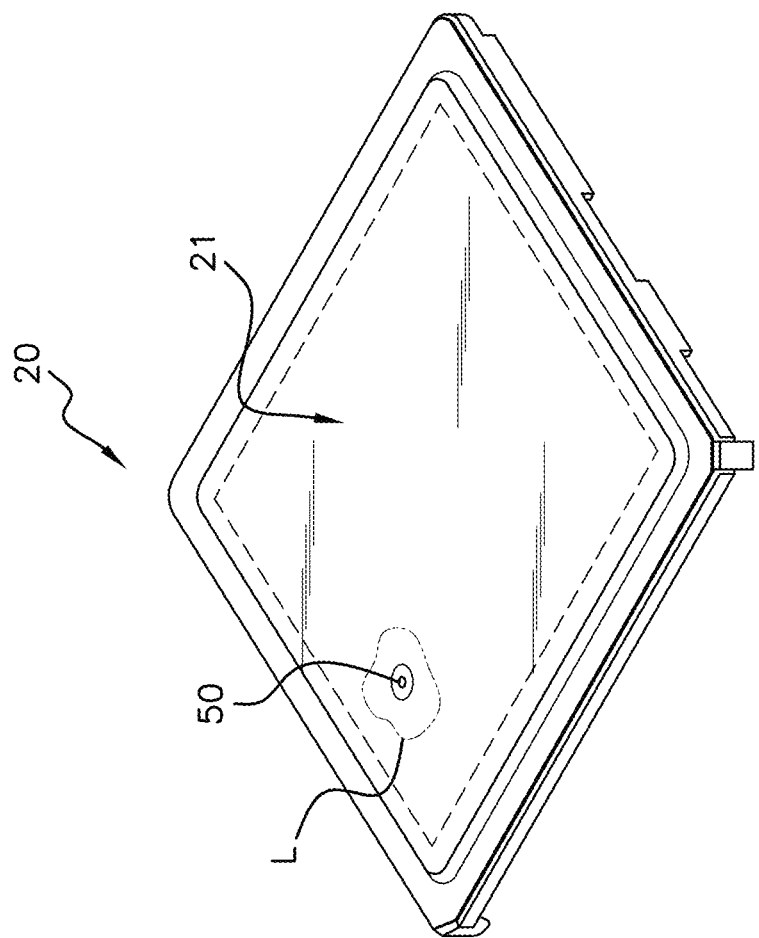

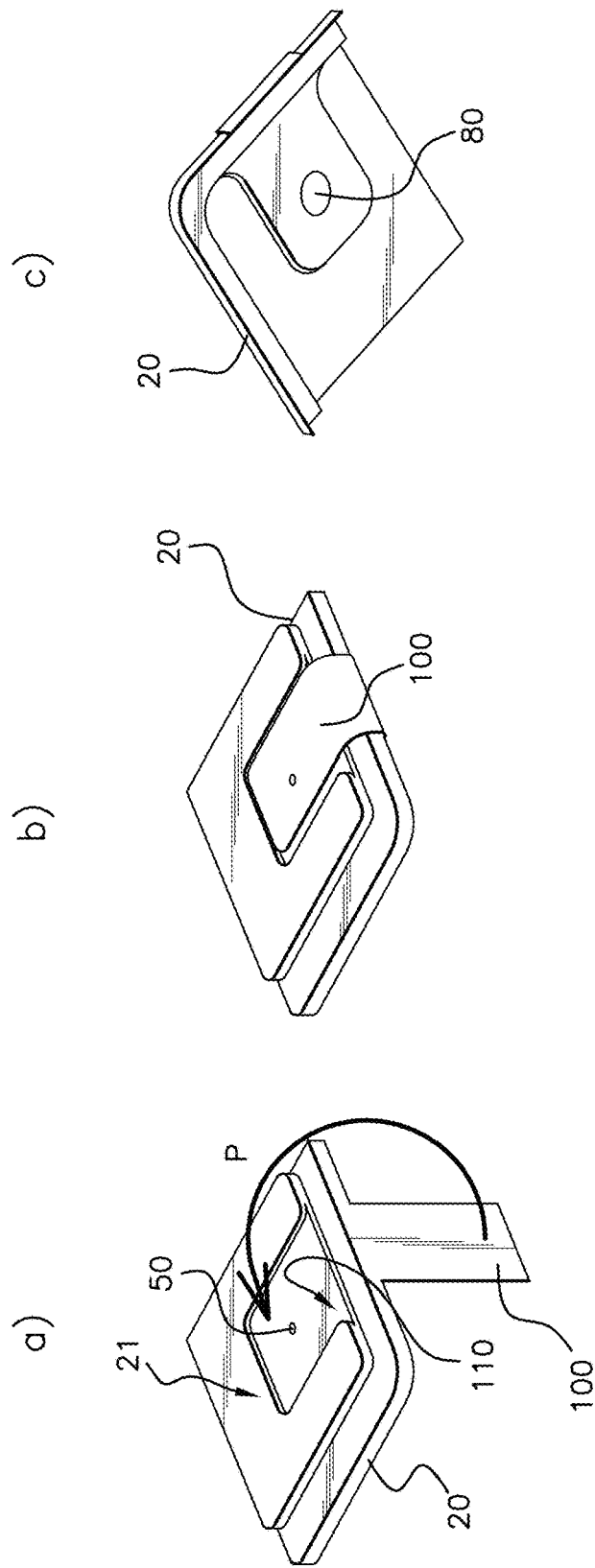

COMPUTER PROVIDED WITH A TIGHT VENTILATOR AND PRODUCTION METHOD

The object of the present invention is a computer provided with a tight ventilator and the production method thereof. The invention has extremely advantageous uses in that it makes it possible to create a liquid-tight but gas-permeable container protected from liquid spraying directed towards the ventilator.

This type of computer is extremely common in the automotive field which will be used as an illustrative example, in no way limiting in itself, and receives electronic components intended to implement processes for the command and the control of the onboard functions in said motor vehicle.

Such a computer is suitable, once closed by means of a cover sealing the casing of the computer, to be fixed on a motor vehicle, in particular in places exposed to possible splashes of a liquid, for example drops of water coming from a wet road.

FIG. 1 shows a sectional view of a computer used in the automotive field for receiving electronic components according to the prior art.

The computer 10 is mainly made up of a casing 30 receiving the electronic components which are mounted on a printed circuit supporting means 60, for example. These electronic components are connected to the outside by means of a connector 40 provided with connection pins. The casing 30 is, in this case, created by molding an aluminum alloy, for example.

The casing 30 of the computer is hermetically closed by means of a cover 20, created in the illustrated example by means of stamped sheet metal. Said cover 20 is provided, in this case, with a ventilator 50 placed in an area L set back from the outer face 21 of the cover 20 in order to protect said ventilator 50 from possible impact that may damage it. FIG. 2 is a perspective view of the cover 20.

The ventilator 50 is, in this case, made up by an orifice created by stamping the sheet metal from which the cover 20 is produced. A liquid-tight but gas-permeable membrane is affixed opposite this orifice, on the outer face 21 or inner face of the cover 20. The ventilating function is thus provided at a lower cost. The on-board computer can thus measure the ambient air pressure, for example, a quantity which is very useful for determining the control parameters of the motor vehicle, without necessarily risking water inlet harmful to the correct operation of the onboard electronics.

Unfortunately, this type of ventilator exhibits poor performance with respect to direct spraying. The approval tests for some specifications require, for example, a guaranteed tightness even in the case of pressurized water (the liquid most often encountered in the life of a motor vehicle) spraying oriented directly onto the orifice of the ventilator 50.

JP 2006 005 162 proposes creating a ventilator, the gas passage orifices of which are placed parallel to the surface and not perpendicularly, but this solution does not solve the problem of pressurized water direct spraying in front of the gas passage orifice. Furthermore, this ventilator has a very complex shape which makes it difficult to create at a restricted cost, or even impossible to create from stamped sheet metal. It is then necessary to resort to a casting in a mold provided with sophisticated mechanisms which inevitably increase the cost price thereof.

The main aim of the invention is to provide a liquid-tight and gas-permeable computer provided with a ventilator that is the most cost-effective possible but which meets the testing requirements under severe conditions of pressurized water direct spraying.

For this purpose, the invention proposes a computer containing electronic components incorporating a liquid-tight and gas-permeable ventilator, characterized in that it includes, on a part of said computer, a means for protecting said ventilator against liquid spraying, which is created by stamping sheet metal making up the part receiving said ventilator, said protection means being placed on one of the edges of the sheet metal part and then being folded onto the ventilator in order to make up, for the latter, a shield against liquid spraying.

The resulting shield makes it possible to break the force of the pressurized spray jets, while nevertheless allowing the flow of the gases.

Advantageously, the computer is made up of a cover and of a casing and the cover is created by stamping sheet metal and incorporates the ventilator. There is, thus, a real economic gain in the production of the assembly made up of the cover incorporating the shield.

According to an improvement, the ventilator is created by stamping the sheet metal of the cover and makes up a single piece with the latter. This results in an even greater gain in creating the assembly made up of the cover, the ventilator and the shield from the same sheet metal.

According to an alternative embodiment, the ventilator incorporated in the cover is a piece attached to the cover.

According to an advantageous embodiment, the protection means is housed in a recess once folded onto the ventilator, so as not to increase the overall dimensions of the part receiving the ventilator. This results in a very compact formation with little risk of tearing off the protection means.

The invention also relates to a motor vehicle incorporating a computer having one of the above features and receiving an on-board electronic computer used for the operation of said motor vehicle.

According to a further aspect, the invention relates to a method of production by stamping sheet metal of a part of a computer containing electronic components and incorporating a liquid-tight and gas-permeable ventilator, the method being characterized in that it comprises the following steps:
- stamping the part of the computer in the sheet metal, reserving on at least one of the edges of the cut sheet metal an additional surface of sheet metal close to the location of the ventilator,
- shaping the part of the computer,
- bending the additional surface close to the location of the ventilator so as to make up, for the latter, a shield against liquid spraying.

Advantageously, the part of the computer, which computer is made up of a casing and of a cover, which receives the ventilator and the shield is the cover thereof.

According to an improvement, the ventilator is created by stamping the sheet metal of the cover and makes up a single piece with the latter.

In an alternative embodiment, the ventilator is a piece attached to the cover.

The invention will be better understood upon reading the following description. This is purely illustrative and should be read in conjunction with the appended drawings in which:

FIG. 1, already described, is a sectional schematic representation of a computer of the prior art, FIG. 2, already described, is a perspective view of a computer cover of the prior art provided with a ventilator, FIG. 3 is a perspective view of a computer cover portion according to the invention, as a top view with the shield not positioned (FIG. 3a), as a top view with the shield positioned (FIG. 3b) and as a bottom view showing the membrane of the ventilator (FIG. 3c).

It should be noted that the figures disclose the invention in detail in order to implement the invention, wherein said figures can, of course, be used to better define the invention if necessary.

In the description, the same reference numbers designate identical or functionally similar elements from one figure to another.

The invention proposes a computer 10 containing electronic components placed on an integrated circuit supporting means 60. This computer 10 incorporates a liquid-tight and gas-permeable ventilator 50. Said ventilator 50 is positioned on a piece created by stamping sheet metal, in this case the cover 20 of the computer 10 in the illustrative example chosen.

It should be noted that the piece in question may be a cover part 20 or even a part other than the cover 20 of the computer 10. The nature of the piece receiving the ventilator 50 depends in fact on the formation of the computer 10 and the illustration made in the present description can in no way limit said installation to the cover 20 alone.

The ventilator 50 is placed, as is known per se, to be set back from the outer surface 21 of the cover 20 (see FIG. 3a). For this purpose, a recess 110 is created in the cover 20 and the ventilator 50, either formed directly during the stamping operation, or attached subsequently (scenario not shown in the figures), does not pass beyond the template of the cover 20.

Another advantage of this recess 110 is that it makes it possible to house the means 100 for protecting said ventilator 50, also called a "shield" hereafter. This protection means 100 is created by stamping the sheet metal receiving the ventilator 50. Advantageously, the protection means 100 is placed on one of the edges of the sheet metal part (the cover 20 in FIGS. 3a, 3b, 3c) and is then folded onto the ventilator 50 in order to make up, for the latter, a shield against liquid spraying.

FIG. 3a shows a section of a corner of the cover 20 in which the ventilator 50 is installed. In this figure, the shield 100 is not yet folded onto the ventilator 50. Continuing with the cover 20, the shield 100 is then put into position and is housed in the recess 110 (see FIG. 3b) according to a movement illustrated by the arrow "P" of FIG. 3a.

It is possible to envisage rigidly connecting the shield 100 to the cover 20 at spots once at the bottom of the recess 110 so as to avoid the risks of tearing or separating the shield 100 from the cover 20. However, this rigid connection must nevertheless allow the gases to be able flow and cannot therefore be made up of a complete weld, but it can consist of spot welding.

The ventilator 50 can either be created during the stamping of the cover 20 and therefore be integral with the latter, or be an attached element housed in the recess 110, the dimensioning of which must then take account the spatial requirement of this attached ventilator 50.

FIG. 3c illustrates a perspective bottom view of the angle of the cover 20 shown from above in FIGS. 3a and 3b. The gas-porous and liquid-tight membrane 80 is shown, which is protected from water spraying by the shield 100.

The invention also relates to a motor vehicle incorporating a computer 10 having one of the above features and receiving an on-board electronic computer used for the operation of said motor vehicle. In this case, the invention is advantageous in that it makes it possible to position, in an easier manner, the computer 10 in the vehicle, in contrast to the prior art embodiments which require precise positioning angles to be provided in order to allow the easy flow of water splashes. Thanks to the invention, the risks of water entering the computer are greatly reduced.

Furthermore, the invention also relates to the method of production by stamping sheet metal of a part of a computer 10 containing electronic components and incorporating a liquid-tight and gas-permeable ventilator 50. The method comprises in particular the following steps:

stamping the part 20 of the computer 10 in the sheet metal, reserving on at least one of the edges of the cut sheet metal an additional surface of sheet metal close to the location of the ventilator 50, shaping the part of the computer 10, bending the additional surface close to the location of the ventilator 50 so as to make up, for the latter, a shield 100 against liquid spraying.

In the claims, the term "include" does not exclude other elements or other steps. The indefinite article "a" does not exclude a plural. The various features presented and/or claimed can be advantageously combined. The presence thereof, in the description or in different dependent claims, does not exclude this possibility. The reference signs can in no way be understood to limit the scope of the invention.

The invention claimed is:

1. A computer (10) containing electronic components incorporating a liquid-tight and gas-permeable ventilator (50), including, on a part (20) of said computer (10), a means (100) for protecting said ventilator (50) against liquid spraying, which is created by stamping sheet metal making up the part (20) receiving said ventilator (50), said protection means (100) being placed on one of the edges of the sheet metal part (20) and then being folded onto the ventilator (50) in order to make up, for the latter, a shield against liquid spraying.

2. The computer (10) as claimed in claim 1, wherein the computer (10) is made up of a cover (20) and of a casing (30) and wherein the cover (20) is created by stamping sheet metal and incorporates the ventilator (50).

3. The computer (10) as claimed in claim 2, wherein the ventilator (50) is created by stamping the sheet metal of the cover (20) and makes up a single piece with the latter.

4. The computer (10) as claimed in claim 2, wherein the ventilator (50) incorporated in the cover (20) is a piece attached to the cover (20).

5. The computer (10) as claimed in claim 2, wherein the protection means (100) is housed in a recess (110) once folded onto the ventilator (50), so as not to increase the overall dimensions of the part receiving the ventilator (50).

6. A motor vehicle incorporating a computer (10) as claimed in claim 2 and receiving an on-board electronic computer used for the operation of said motor vehicle.

7. The computer (10) as claimed in claim 1, wherein the ventilator (50) is created by stamping the sheet metal of the cover (20) and makes up a single piece with the latter.

8. The computer (10) as claimed in claim 7, wherein the protection means (100) is housed in a recess (110) once folded onto the ventilator (50), so as not to increase the overall dimensions of the part receiving the ventilator (50).

9. A motor vehicle incorporating a computer (10) as claimed in claim 7 and receiving an on-board electronic computer used for the operation of said motor vehicle.

10. The computer (10) as claimed in claim 1, wherein the ventilator (50) incorporated in the cover (20) is a piece attached to the cover (20).

11. The computer (10) as claimed in claim 10, wherein the protection means (100) is housed in a recess (110) once folded onto the ventilator (50), so as not to increase the overall dimensions of the part receiving the ventilator (50).

12. A motor vehicle incorporating a computer (10) as claimed in claim 10 and receiving an on-board electronic computer used for the operation of said motor vehicle.

13. The computer (10) as claimed in claim 1, wherein the protection means (100) is housed in a recess (110) once folded onto the ventilator (50), so as not to increase the overall dimensions of the part receiving the ventilator (50).

14. A motor vehicle incorporating a computer (10) as claimed in claim 13 and receiving an on-board electronic computer used for the operation of said motor vehicle.

15. A motor vehicle incorporating a computer (10) as claimed in claim 1 and receiving an on-board electronic computer used for the operation of said motor vehicle.

16. A method of production by stamping sheet metal of a part (20) of a computer (10) containing electronic components and incorporating a liquid-tight and gas-permeable ventilator (50), characterized in that it comprises the following steps:
   stamping the part (20) of the computer (10) in the sheet metal, reserving on at least one of the edges of the cut sheet metal an additional surface of sheet metal close to the location of the ventilator (50),
   shaping the part (20) of the computer (10),
   bending the additional surface close to the location of the ventilator (50) so as to make up, for the latter, a shield against liquid spraying.

17. The production method as claimed in claim 16 wherein the part (20) of the computer (10), which computer is made up of a casing (30) and of a cover (20), which receives the ventilator (50) and the shield is the cover (20) thereof.

18. The production method as claimed in claim 17 wherein the ventilator (50) is created by stamping the sheet metal of the cover (20) and makes up a single piece with the latter.

19. The production method as claimed in claim 16 wherein the ventilator (50) is created by stamping the sheet metal of the cover (20) and makes up a single piece with the latter.

20. The production method as claimed in claim 16 wherein the ventilator (50) is a piece attached to the cover (20).

* * * * *